United States Patent
Magrath

(10) Patent No.: US 7,948,405 B2
(45) Date of Patent: May 24, 2011

(54) SAMPLE RATE CONVERTER

(75) Inventor: Anthony J. Magrath, Edinburgh (GB)

(73) Assignee: Wolfson Microelectronics plc, Edinburgh (GB)

(*) Notice: Subject to any disclaimer, the term of this patent is extended or adjusted under 35 U.S.C. 154(b) by 0 days.

(21) Appl. No.: 12/578,366

(22) Filed: Oct. 13, 2009

(65) Prior Publication Data
US 2010/0091922 A1 Apr. 15, 2010

(30) Foreign Application Priority Data
Oct. 13, 2008 (GB) .................................. 0818759.3

(51) Int. Cl.
*H03M 7/00* (2006.01)
(52) U.S. Cl. .......................................... 341/61; 708/313
(58) Field of Classification Search ................... 341/61; 708/290, 313
See application file for complete search history.

(56) References Cited

U.S. PATENT DOCUMENTS

| 6,005,901 | A | 12/1999 | Linz |
| 6,061,704 | A * | 5/2000 | Ostman et al. ............... 708/313 |
| 6,208,671 | B1 * | 3/2001 | Paulos et al. ................. 370/545 |
| 6,518,894 | B2 * | 2/2003 | Freidhof ......................... 341/61 |
| 6,747,858 | B1 | 6/2004 | Sculley et al. |
| 2002/0105448 | A1 | 8/2002 | Freidhof |
| 2004/0120361 | A1 | 6/2004 | Yu et al. |

FOREIGN PATENT DOCUMENTS

| EP | 0 323 200 A2 | 7/1989 |
| GB | 2 386 806 A | 9/2003 |

* cited by examiner

*Primary Examiner* — Khai M Nguyen
(74) *Attorney, Agent, or Firm* — Dickstein Shapiro LLP

(57) ABSTRACT

A sample rate converter circuit receives a first signal at a first sampling frequency and for outputs a second signal, representative of the first signal, having a second sampling frequency. The sample rate converter comprises: a buffer, for storing data samples received from said first signal; a first loop circuit, for receiving a first clock signal corresponding to the first sampling frequency and a second clock signal corresponding to the second sampling frequency, and for generating an estimate of a ratio of the first sampling frequency to the second sampling frequency; and a second loop circuit, for receiving the first clock signal, the second clock signal and the estimate of the ratio of the first sampling frequency to the second sampling frequency, and for outputting a write pointer so that the data samples can be stored in the buffer, and for outputting a read pointer so that the data samples can be read from the buffer, with a first offset between the read pointer and the write pointer, such that the first offset is substantially independent of the ratio of the first sampling frequency to the second sampling frequency.

20 Claims, 6 Drawing Sheets

SAMPLE RATE CONVERTER

The present invention relates to sample rate converters, and particularly to a sample rate estimator for use in sample rate converters.

BACKGROUND OF THE INVENTION

Sample rate converters are devices that are used to convert an input digital signal having a first, input, sample rate to an output digital signal having a different second, output, sample rate. They are common to many different fields of signal processing, including, but not limited to, communications and audio systems. For example, in audio systems and applications, the sample rate of a CD is 44.1 kHz; the sample rate of a digital audio tape (DAT) is typically 48 kHz. Clearly, if data is required to be transferred from CD to DAT, the sample rate must be converted such that the audio can be output at the correct frequency from the DAT, i.e. such that it does not sound "speeded up".

Many different architectures are known for sample rate converters. One such architecture is an asynchronous sample rate converter 10 (ASRC), for example as shown in FIG. 1. The ASRC 10 has a rate estimator 12, which receives a clock signal from the first, input, sample-rate domain, and a clock signal from the second, output, sample-rate domain, and calculates a delay variable a on the basis of the two clock signals.

A polynomial interpolator 14 receives the delay variable α and calculates the output signal data samples (i.e. the data having a different sample rate) by interpolating between the input signal data samples using α. This aspect will be described in greater detail with respect to FIG. 3.

In the illustrated example, an upsampling filter 16 is used to upsample the input data such that the polynomial interpolator 14 is less complex. That is, by increasing the number of data points in the input data, the required accuracy of the interpolation is less, and a lower-order interpolator can be used. A downsampling filter 18 is then used to downsample the data output from the interpolator 14.

As a by-product of generating the delay variable a, the rate estimator 12 may also calculate a ratio of the input sample rate to the output sample rate. Such a ratio may be useful for other parts of the system in which the sample rate converter 10 is incorporated.

Thus it is desirable that the rate estimator 12 should converge as quickly as possible to the correct values of the frequency ratio and the delay variable α, such that the sample rate converter 10 can begin to output data as soon as possible after start up.

FIG. 2 is a graph illustrating the delay variable a used to calculate the output data.

In this illustrative example, an analogue input signal 30 has a smoothly varying amplitude over time. An input digital signal is generated by periodically sampling the analogue signal 30 at an input sample rate to obtain input samples (illustrated as solid lines in FIG. 2). In this example, the desired output samples (illustrated by dashed lines in FIG. 2) are synchronized with an output clock signal which has a higher frequency than the input clock signal. The delay variable a corresponds to the time difference between corresponding samples in the input data and the output data. More specifically, the delay variable a associated with each sample in the output data is the time difference between that sample and the previous sample in the input data. Thus, as the output sample rate is higher than the input sample rate, in FIG. 2, α starts at one and is then ramped down with each sample by an amount that is proportional to the difference between the input and output sample rates. When α becomes less than zero, the value of α wraps with modulo 1, and starts decreasing again from a value just less than one. At the point of wrapping, an additional output sample is generated.

It will be apparent to those skilled in the art that alternative definitions of α can be used without substantially affecting the operation of the converter. For example, α could be defined as being equal to zero initially before being increased to one (the normalized period of the input clock signal), and then wrapping back to zero.

The polynomial interpolator 14 comprises a buffer that is used to store the input data having an input sample rate $FS_I$. FIG. 3 is an illustration of this buffer 20, which is depicted as a circle in the present case. The buffer 20 comprises a number of memory locations, or slots, 22, in which data samples are stored. A read pointer 24 points to a slot which contains data that is to be read out to the polynomial interpolator, and used to calculate a new data sample for the output data having an output sample rate $FS_O$. Data is read out of the buffer 20 at the output sample rate $FS_O$. A write pointer 26 points to a slot in which input data having the input sample rate $FS_I$ is to be written. Data is written to the buffer 20 at the input sample rate $FS_I$.

Although the buffer 20 is depicted as a circle, it will be apparent to those skilled in the art that the buffer 20 may take a linear form, with the pointers 24, 26 cycling back to the first address of the buffer upon reaching the end address of the buffer.

Once the data has been read out of a particular slot 22, the data in that slot may be overwritten with new data. $FS_I$ and $FS_O$ are generally different, and thus there necessarily exist mechanisms for preventing the read pointer 24 from catching up with the write pointer 26 or vice versa. In the example illustrated in FIG. 2, the output sample rate is higher than the input sample rate. Thus, when a wraps around to one again (i.e. one extra output sample has been generated), the read pointer 24 reads a data sample from the same slot 22 twice. This compensates for the inherent frequency difference between the input sample rate $FS_I$ and the output sample rate $FS_O$.

However, so-called clock "jitter"—short-term variation in the clock frequencies—may cause the write pointer 26 to catch up with the read pointer 24, or the read pointer 24 to catch up with the write pointer 26. In the former case, data would be overwritten that has not yet been read. In the latter, an entire buffer's worth of data samples would not be read. Either of these events would cause the sample rate converter 10 to malfunction.

If the rate estimator 12 is to be used to generate read and write pointers for the buffer, it is desirable that these never be equal to one another. That is, the read and write pointers should not point to the same data element in the buffer, causing the sample rate converter 10 to malfunction.

Further, as mentioned above, there may be a certain amount of jitter in the input clock signal, i.e. short-term variation in the clock frequency. It is desirable that the sample rate converter 10 should be resistant to such jitter, and continue to output stable values of α and the frequency ratio, and different values of the read and write pointers, regardless of the jitter in the input clock frequency.

SUMMARY OF THE INVENTION

According to a first aspect of the present invention, there is provided a sample rate converter circuit, for receiving a first signal at a first sampling frequency and for outputting a second signal, representative of said first signal, having a second sampling frequency, said sample rate converter comprising:
- a buffer, for storing data samples received from said first signal;
- a first loop circuit, for receiving a first clock signal corresponding to said first sampling frequency and a second clock signal corresponding to said second sampling frequency, and for generating an estimate of a ratio of the first sampling frequency to the second sampling frequency; and
- a second loop circuit, for receiving said first clock signal, said second clock signal and said estimate of the ratio of the first sampling frequency to the second sampling frequency, and for outputting a write pointer so that said data samples can be stored in the buffer, and for outputting a read pointer so that said data samples can be read from the buffer,
- with a first offset between said read pointer and said write pointer, such that said first offset is substantially independent of said ratio of the first sampling frequency to the second sampling frequency.

According to a second aspect of the present invention, there is provided a method of converting a signal sample rate from a first sampling frequency to a second sampling frequency, comprising:
- receiving a first signal at the first sampling frequency;
- storing in a buffer data samples received from said first signal;
- receiving a first clock signal corresponding to said first sampling frequency and a second clock signal corresponding to said second sampling frequency in a first loop circuit, and generating an estimate of a ratio of the first sampling frequency to the second sampling frequency; and
- receiving said first clock signal, said second clock signal and said estimate of the ratio of the first sampling frequency to the second sampling frequency in a second loop circuit; and
- outputting a write pointer so that said data samples can be stored in the buffer, and outputting a read pointer so that said data samples can be read from the buffer, with a first offset between said read pointer and said write pointer, such that said first offset is substantially independent of said ratio of the first sampling frequency to the second sampling frequency.

According to a third aspect of the present invention, there is provided a sample rate converter circuit, for receiving a first signal having a first sampling frequency and for outputting a second signal, representative of said first signal, having a second sampling frequency, said sample rate converter comprising:
- a loop circuit, for receiving a first clock signal corresponding to said first sampling frequency and a second clock signal corresponding to said second sampling frequency, and for generating an estimate of a frequency ratio of the first sampling frequency to the second sampling frequency, wherein the loop circuit comprises:
- a multiplier, for multiplying an error signal of the loop circuit by a gain coefficient, wherein said gain coefficient is dynamically adjusted to change the rate of convergence of the loop circuit to the estimate of the frequency ratio,
- wherein the circuit is adapted to compensate for the adjustment of the gain coefficient by correspondingly adjusting said error signal.

According to a fourth aspect of the present invention, there is provided a method of controlling a sample rate converter circuit, the sample rate converter circuit being adapted to receive a first signal having a first sampling frequency and to output a second signal, representative of said first signal, having a second sampling frequency, said sample rate converter comprising:
- a loop circuit, for receiving a first clock signal corresponding to said first sampling frequency and a second clock signal corresponding to said second sampling frequency, and for generating an estimate of a frequency ratio of the first sampling frequency to the second sampling frequency, wherein the loop circuit comprises:
- a multiplier, for multiplying an error signal of the loop circuit by a gain coefficient,
- wherein the method comprises dynamically adjusting said gain coefficient to change the rate of convergence of the loop circuit to the estimate of the frequency ratio,
- and further comprises compensating for the adjustment of the gain coefficient by correspondingly adjusting said error signal.

According to a fifth aspect of the present invention, there is provided a signal processing circuit, comprising an input for receiving a first signal at a first sampling frequency and an output for outputting a second signal, representative of said first signal, at a second sampling frequency, said signal processing circuit comprising a sample rate converter circuit in accordance with the first or third aspect of the invention.

BRIEF DESCRIPTION OF THE DRAWINGS

For a better understanding of the present invention, and to show more clearly how it may be carried into effect, reference will now be made, by way of example, to the following drawings, in which.

DETAILED DESCRIPTION OF THE PREFERRED EMBODIMENTS

Figure 1:
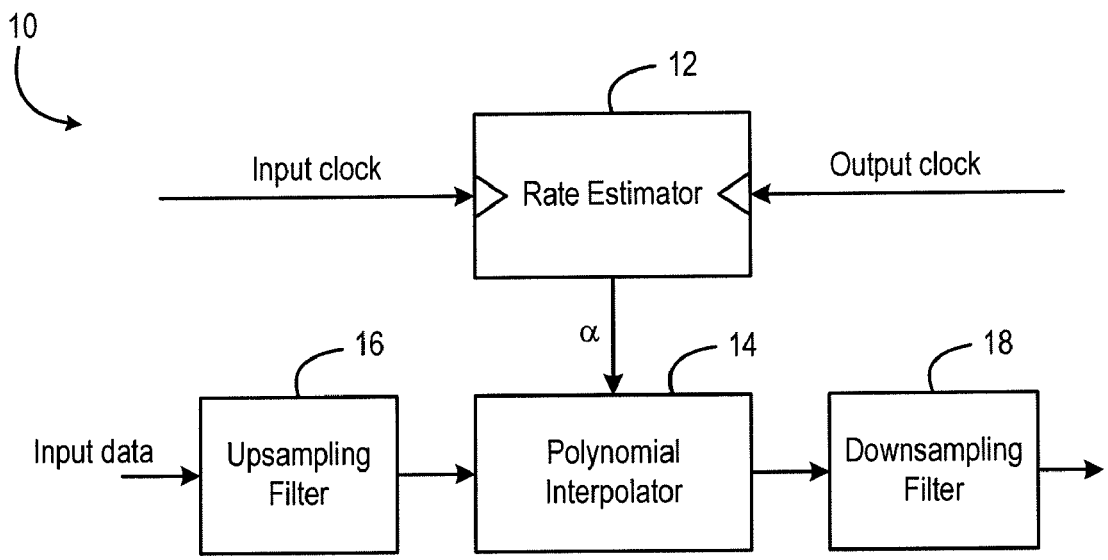
FIG. 1 is a block schematic diagram of an asynchronous sample rate converter.
Figure 2:
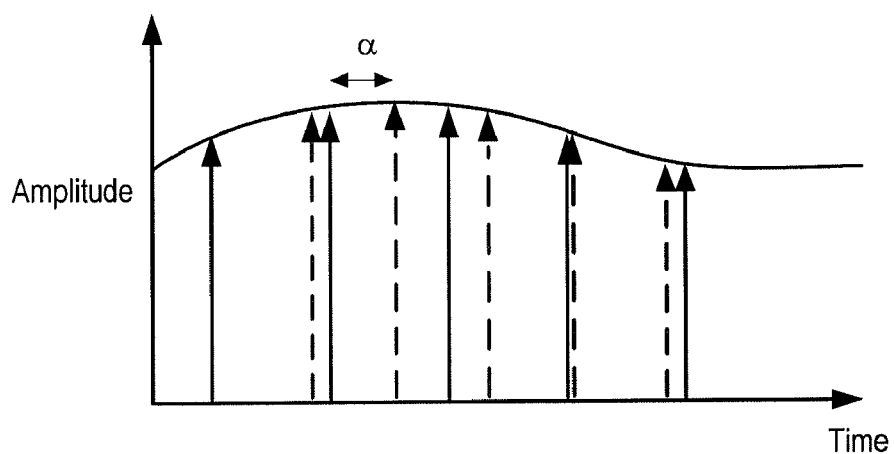
FIG. 2 illustrates sample positions of the input and output samples.
Figure 4:
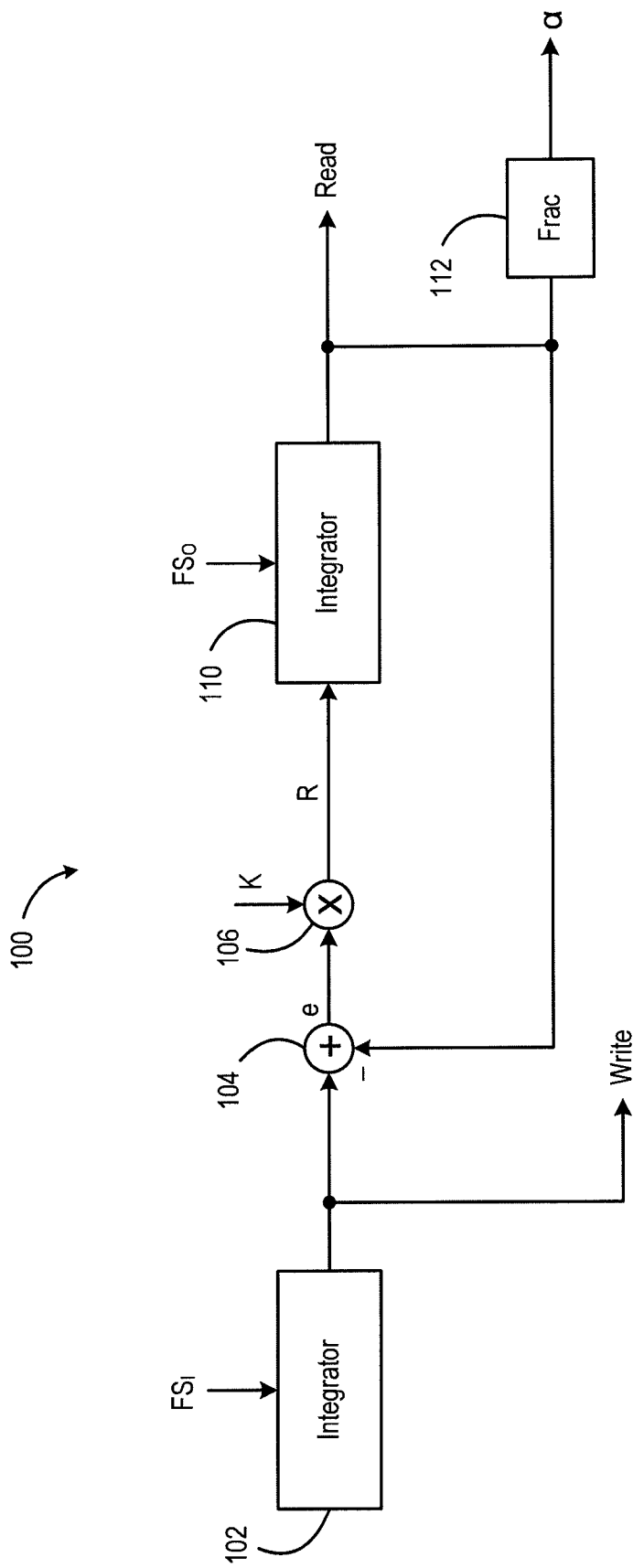
FIG. 4 shows a first rate estimator for use in the sample rate converter of FIG. 1.

FIG. 4 illustrates an example of a rate estimator 100 for use as the rate estimator 12 in the sample rate converter 10 of FIG. 1.

The rate estimator 100 comprises an input integrator 102 that receives a clock signal having a frequency $FS_I$ corresponding to the sample rate of the input signal. The input integrator 102 essentially acts as a counter, therefore, clocked at the frequency $FS_I$.

Figure 3:
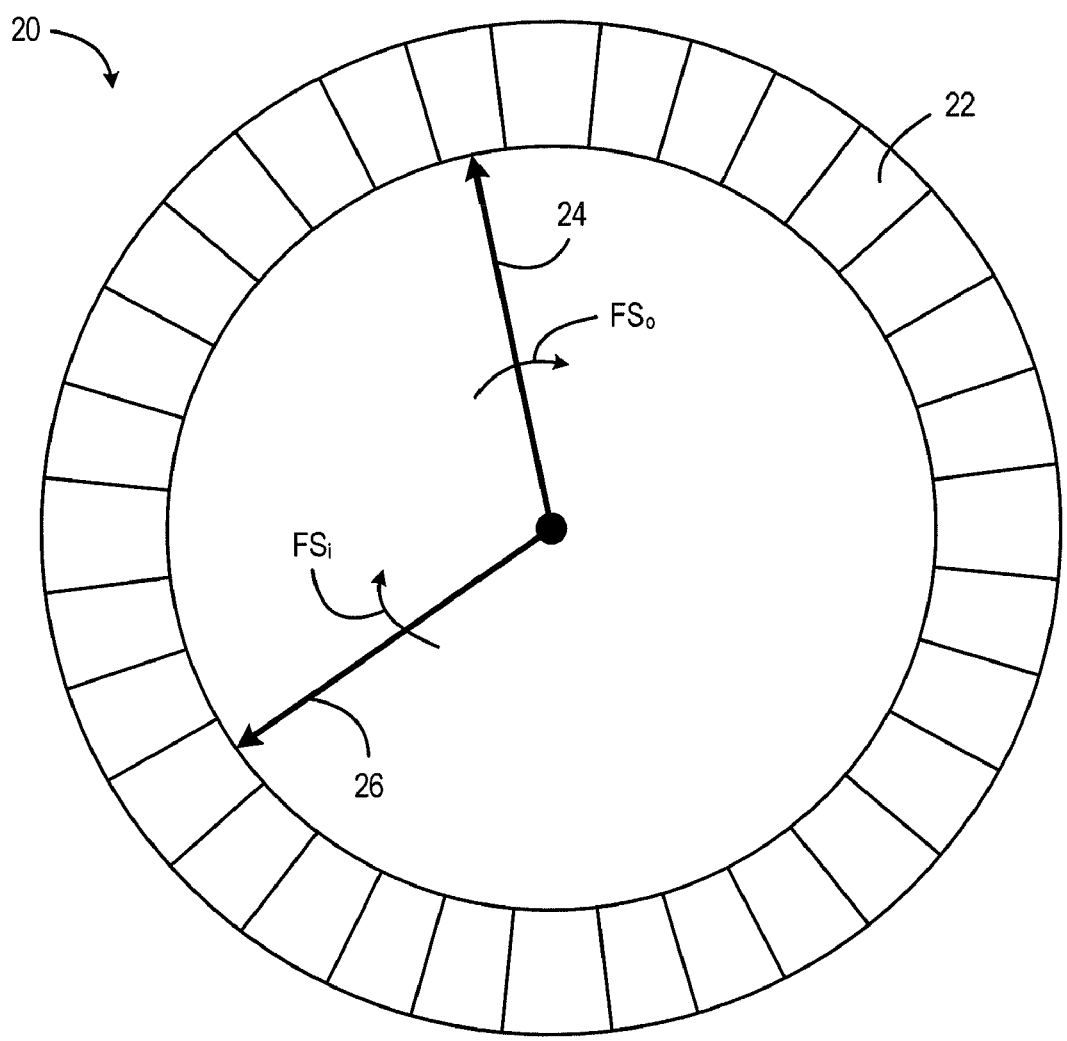
FIG. 3 illustrates a buffer in the polynomial interpolator of FIG. 1.

The output "Write" of the input integrator 102 is used to generate a write pointer for writing data to a buffer, for example as illustrated in FIG. 3. A certain number of least-significant bits (LSBs) of the output of the input integrator 102 may be used for this purpose. In a relatively simple example where the buffer has eight data slots, three LSBs may be used to define the write pointer.

The output of the input integrator 102 is also fed to a control loop. A feedback signal is subtracted from the output of the input integrator 102 in an adding element 104, generating an error signal e. The error signal e is multiplied by a gain coefficient K in a multiplying element 106 to generate a signal R which, as will be shown in more detail later, is an estimate of the ratio of the input sample rate and the output sample rate. The output R of the multiplying element 106 is input to an output integrator 110, which receives a clock signal having a frequency corresponding to the output sample rate $FS_O$. The output integrator 110 is therefore clocked at $FS_O$. As such, the output of the output integrator 110 may be used to generate a read pointer "Read" similar to the generation of the write pointer described above. That is, a certain number of LSBs may be used to define the read pointer. In fact, since the output integrator is able to generate a fractional output, the desired number of integer bits is used to define the read pointer.

The output of the output integrator 110 is passed back to the adding element 104 for use as the feedback signal mentioned above. The output of the output integrator 110 is also applied to a filter 112, which is used to separate off the fractional part of the signal, which is then used as the value of the delay variable α.

Thus, on every input clock, the output of the input integrator 102 increments by 1. On every output clock the output of the output integrator 110 increments by R. When the loop has converged, the error signal e will stabilise, causing the rate of change of the input and output integrators 102, 110 to be equal.

The rate of change of the output of the input integrator 102 is equal to $L \times FS_I$, where L is the upsampling factor of the upsampling filter 16 in FIG. 1. The rate of change of the output of the output integrator 110 is equal to $R \times M \times FS_O$, where M is equal to the downsampling factor of the downsampling filter 18 in FIG. 1.

The value of R stabilises by negative feedback. If the value of R is too low, the rate of change of the output integrator 110 reduces, and therefore the output of the error adding element 104 increases, causing R to increase again.

Thus, once the loop has converged, $$R = \frac{L.FS_I}{M.FS_O},$$

and R is an estimate of the ratio of the input sample rate and the output sample rate (modified by the upsampling L and downsampling M). Hence the fractional part of R is also equal to step size of the α-value needed by the polynomial interpolator 14. Therefore the value of α can easily be obtained by first integrating R(n) then obtaining the fractional part.

The read pointer for the buffers must change at the same time that the α-value wraps. This property is observed in the integer part of the output of the output integrator 110. Thus, the integer part of the output of the output integrator 110 can be used to generate the read pointer.

However, the rate estimator 100 described with respect to FIG. 4 suffers from a number of problems.

One problem can be seen by analysing the signal output from the adding element 104. The signal e output from the adding element 104 is the difference between the outputs of the two integrators 102, 110. It may be seen by analysing the multiplying element 106 that e=R/K, where R is an estimate of the sample-rate ratio.

Since the write and read pointers are derived from the respective outputs of the integrators 102, 110, and it can be shown that the difference between the write and read pointers (the pointer offset, $P_O$) is equal to $$P_O = e \bmod N,$$

i.e.

$$P_O = \frac{R}{K} \bmod N$$

where N is the length of the buffer. The pointer offset is therefore dependent on the sample-rate ratio. Since the sample rate ratio varies according to the application, and may also drift over time, it is not possible to guarantee that pointer collision cannot occur.

The issue is compounded by clock jitter.

The loop attenuates jitter on the input $FS_I$ clock for $FS_I$ frequencies above a cutoff frequency that is defined by the value of K. That is, it ensures that variations in the clock timing compared to ideal regular clock instants do not affect the accuracy of the α value. As the read pointer is also derived from the control loop, the read pointer is stable too and not affected by jitter on the input clock.

However, at any frequency there is no jitter attenuation on the write pointer, which is derived from the output of the input integrator 102. Thus, the write pointer may move backwards and forwards relative to an "ideal" value. As the read pointer is relatively stable, this means that the write pointer may catch up with the read pointer, causing the sample rate converter to malfunction as described above. Since the pointer offset is dependent on sample-rate ratio, it is not possible to guarantee how much jitter can be tolerated before the pointers catch up and the converter malfunctions.

To provide good attenuation, it is typical to use a low cutoff frequency in the region of a few Hz. It can be shown that the cutoff frequency is approximately equal to $$f_c \approx \frac{M.FS_O.K}{2\pi}.$$

For typical values, such as M=2, $FS_O$=48 kHz, and $f_c$=8 Hz, the value of K would be in the order of $2^{-11}$.

This small value of K has consequences with regard to pointer collision as the loop settles during start-up.

In order to prevent the write and read pointers crossing during settling (the period when the loop converges and the value of R stabilises to its final value), it is necessary to maintain the condition that $P_O<N$, and this results in the following lock condition $$\left|\frac{R_{lock}}{K}\right| < N$$

or $$|R_{lock}| < N.K$$

i.e. R needs to be within N.K of its final value to guarantee that no glitches occur. Since K has a very low value it takes several hundred milliseconds before the loop has settled adequately to guarantee that pointer collisions cannot occur. This is an unacceptably long time in many applications.

The convergence time is inversely proportional to the value of K. Thus, a relatively high value of K results in a relatively short convergence time. However, a high value of K also causes considerable "ripple" in the output of the control loop. That is, a high value of K will cause the output to reach the correct output value quickly, but overshoot and oscillate about the converged output value. The ripple will cause a high level of distortion in the sample-rate converter since the value of a will fluctuate from sample-to-sample. A high value of K also has the disadvantage that the loop cutoff frequency is higher and the jitter attenuation is poor.

Figure 5:
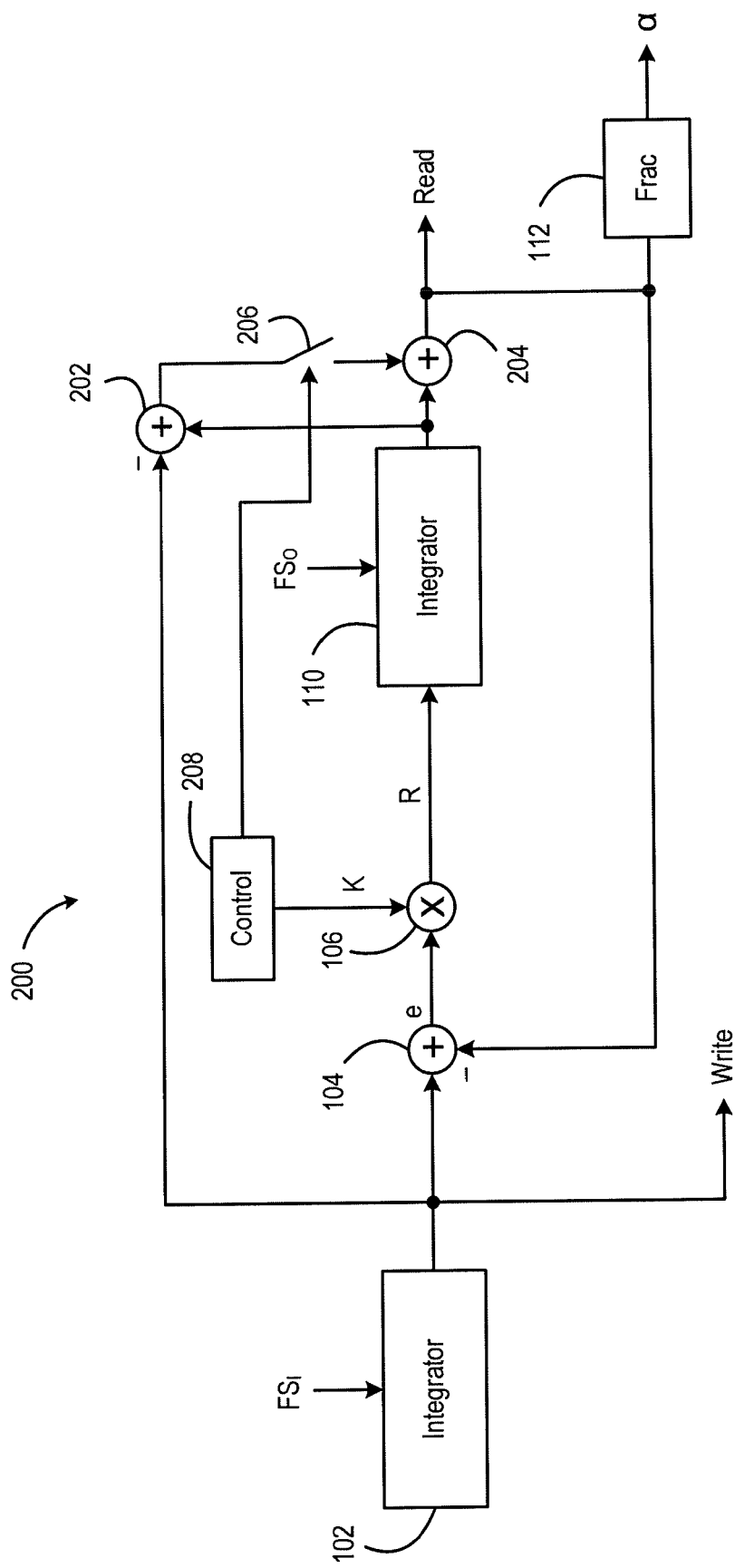
FIG. 5 shows a second rate estimator for use in the sample rate converter of FIG. 1.

FIG. 5 illustrates a rate estimator 200 according to the present invention.

The rate estimator 200 is similar to the rate estimator 100 described with respect to FIG. 4. Components having similar reference numerals are similar to their counterparts in FIG. 4, and so will not be further described herein.

According to the present invention, the gain value K applied in the multiplying element 106 is adapted to improve the convergence time of the loop, without producing substantial oscillation in the output of the control loop. This is achieved by starting with a relatively high value of K, and then reducing that value as the output value approaches the correct value.

In one embodiment, K may take an initial value (e.g. 0.5), and then its value halves for every doubling of sampling time. A person skilled in the art will be able to think of many schemes whereby the value of K is reduced over time.

However, when the value of K is reduced, the output of the multiplying element 106, R, is proportionately reduced. If the value of K is reduced by half, say, the value of R is also reduced by half. This effect prevents the loop from converging steadily to the correct value. Instead, the output of the loop will jump downwards each time the K value is changed.

In the illustrated embodiment of FIG. 5, the value of K is repeatedly halved, under the control of a control block 208. As mentioned above, the value of K may be halved whenever the elapsed sampling time doubles.

To counteract this effect, the rate estimator 200 doubles the value of e, the signal output from the adding element 104, for the sample immediately after the K value is changed. This is achieved by means of an adding element 202, which subtracts the output of the input integrator 102 from the output of the output integrator 110, which must be a delaying integrator. The output of the adding element 202 is selectively added to the output of the output integrator 110 in another adding element 204. This has the effect of doubling the value of the signal e when the output of the adder 204 is subtracted from the output of the input integrator 102 in the adder 104. A switch 206, also operating under the control of the control block 208, is employed so that the output of the adding element 202 is added to the output of the output integrator 110 (and hence the signal e is doubled) only when the K value is changed. Thus, the control block 208 ensures that the switch 206 is closed when the K value is changed, and kept open otherwise.

The rate estimator 200 therefore overcomes the problem of slow convergence to the correct output value. By progressively reducing the value of K, the convergence of the control loop is initially quick, but then slowed to prevent ripple in the output value. No jumps are experienced in the output signal when the value of K changes, by appropriate compensation of the error signal on the samples immediately after the K value is changed.

It will be apparent to those skilled in the art that, were a different scheme of reducing K used, alternative means would be necessary to compensate the error signal for the reduction in K. For example, if K is reduced by a factor of i, where i is an integer, extra adding elements can be included so that the output of the adding element 204, is i times the output of the output integrator 110.

In one embodiment, the adaption of K takes place upon start-up of the sample rate converter. However, the adaption of K may also take place if it is detected that the output value has drifted significantly from an ideal value, for example.

Figure 6:
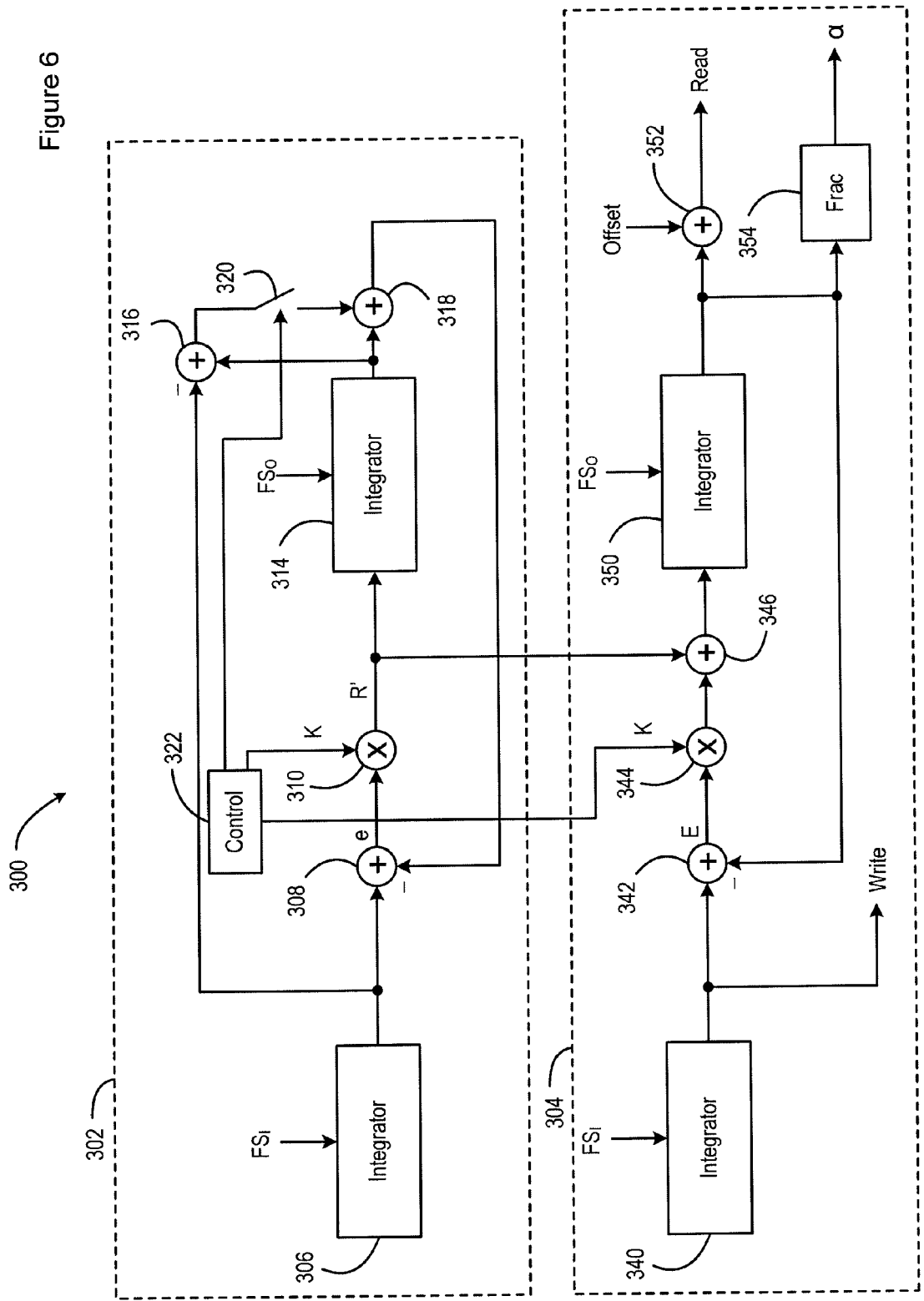
FIG. 6 shows a third rate estimator for use in the sample rate converter of FIG. 1.

FIG. 6 shows a further rate estimator 300 according to the present invention.

The rate estimator 300 uses an architecture with two blocks 302, 304 containing respective control loops to overcome the problem of the read and write pointers overtaking one another and prevent the offset being dependent on the sample-rate ratio. In addition, in the illustrated embodiment, the loop in one of the blocks 302 uses an adaptive value of K as described above, so that the circuit quickly converges to the correct output value.

Thus the rate estimator 300 comprises a first block 302 whose function is to generate an estimate of the frequency ratio between the input and output sample rates for use as an offset in a second block 304. The first block 302 comprises an input integrator 306 that receives a clock signal $FS_I$ having a frequency corresponding to the input sample rate. The input integrator 306 therefore operates as a counter. The output of the input integrator 306 is fed to a control loop. A feedback signal is subtracted from the output of the input integrator 306 in an adding element 308, generating an error signal e. The error signal e is multiplied by a gain coefficient K in a multiplying element 310 to generate a signal R' which, as was shown previously with respect to FIG. 4, is an estimate of the ratio of the input sample rate and the output sample rate. The signal R' is input to an output integrator 314, which is clocked at a frequency corresponding to the output sample rate $FS_O$. The output of the output integrator 314 is used as the feedback signal mentioned above with respect to the adding element 308.

In the illustrated embodiment, the value of K is adapted as mentioned previously with respect to FIG. 5, under the control of a control block 322. Thus, to counteract the effects of reducing K, adding elements 316, 318 and a switch 320 are included, corresponding to adding elements 202, 204 and switch 206 in FIG. 5, with the switch 320 also being controlled by the control block 322. Thus, whenever the value of K is halved, the error signal e is doubled by closing the switch 320.

The rate estimator 300 further comprises a second block 304. A further input integrator 340 is provided, also being clocked at the frequency $FS_I$ corresponding to the input sample rate. The output of the input integrator 340 is used to generate a write pointer "Write" for writing data to a buffer, for example as illustrated in FIG. 3. A certain number of least-significant bits (LSBs) of the output of the input integrator 340 may be used for this purpose. In a relatively simple example where the buffer has eight data slots, three LSBs may be used to define the write pointer.

The output of the input integrator 340 is also fed to a control loop. A feedback signal is subtracted from the output of the input integrator 340 in an adding element 342, generating an error signal E. The error signal E is multiplied by a gain coefficient K' in a multiplying element 344, with the value of K' again being controlled by the control block 322. The value of K' is typically ⅛ of the value of K used in the first control loop, and thus the value of K' is varied as the value of K is varied. As an alternative, the value of K' may be kept the same as the value of K used in the first control loop, but the first loop may be run 8 times as fast as the second loop. Other combinations of ratios of the multiplying values and the loop rates are also possible.

According to the present invention, the output of the multiplying element 344 is added in an adding element 346 to the signal R', output from the multiplying element 310 in the first loop 302. The output of the adding element 346 is input to an output integrator 350, which is clocked at a frequency corresponding to the output sample rate $FS_O$. As such, the output of the output integrator 350 may be used to generate a read pointer. However, in this embodiment an extra offset is required to be added to the output integrator 350 output in an adding element 352. This aspect will be described in greater detail below. The output of the adding element 352 may then be used to generate the read pointer "Read", similar to the generation of the write pointer described above. That is, a certain number of LSBs from the integer part of the word may be used to define the read pointer.

The output of the output integrator 350 is further used as the feedback signal mentioned above with respect to the adding element 342. The output of the output integrator 350 is also used to generate the value of the delay variable α, by taking the fractional part of the signal in a filter 354.

Thus, one of the actions of the first loop 302 is to generate a signal R' that is an estimate of the ratio of the input and output sample rates. This is then supplied to the second loop 304 as an offset. In the illustrated embodiment, the first loop 302 also comprises an adaptive value of K, with appropriate compensation to the error signal e, such that the output of the control loop 302 rapidly and smoothly converges to a stable value of R'. However, it will be apparent to those skilled in the art that the adaptive value of K is not necessary for this embodiment to operate correctly.

By adding the signal R' to the forward branch of the second control loop 304, the error signal E output from the adding element 342 is driven substantially to zero. As described above, the read pointer "Read" and the write pointer "Write" are derived from the outputs of the output integrator 350 and the input integrator 340, respectively. Therefore, if the error signal E is zero, the offset between the read and write pointers is zero, and independent of the sample-rate ratio.

Of course, in general it is not desirable for the read and write pointers to be the same, and therefore an offset is added in the adding element 352, before generating the read pointer "Read". In one embodiment, the offset is equal to half the length of the buffer, in order that the pointers should be spaced as far apart as possible. Thus the pointers are maximally tolerant to short-term variations, or jitter, in the sample-rate ratio.

In one embodiment, to prevent interaction between the first and second loops in the first block 302 and the second block 304 respectively, the loop circuits may be adapted such that the time constants of each loop differ from each other. As mentioned above, this may be achieved by running the loops at different frequencies, by utilizing different values of K in each loop, or a combination of these. As an alternative example, the loop in the first block 302 may be run at four times the frequency of the loop in the second block 304, and the K' value used in the second block 304 may be half the K value used in the first block 302.

The present invention has therefore provided a rate estimator with an adaptive gain coefficient to ensure that a control loop converges as quickly as possible to a stable output value. To counteract the adjustment of the K value, compensation is provided for the sample immediately following adjustment of the K value, so that the output value is smoothly adapted.

In a further aspect, a rate estimator is provided with a dual-loop architecture. A first loop of the rate estimator generates a ratio of an input sample rate to an output sample rate and provides that ratio to a second loop as a first offset. The second loop generates read and write pointers for access to a buffer containing sample data, where the first offset ensures that a second offset between the read and write pointers is substantially independent of the sample-rate ratio.

It should be noted that the switches described herein can be implemented in a number of different ways (for example, MOS transistor switches or MOS transmission gate switches) depending upon, for example, an integrated circuit's process technology or the input and output voltage requirements.

The sample rate converters described herein are preferably incorporated in an integrated circuit. For example, the integrated circuit may be part of an audio and/or video system, such as an MP3 player, a mobile phone, a camera or a satellite navigation system, and the system can be portable (such as a battery-powered handheld system) or can be mains-powered (such as a hi-fi system or a television receiver) or can be an in-car, in-train, or in-plane entertainment system.

Figure 7:
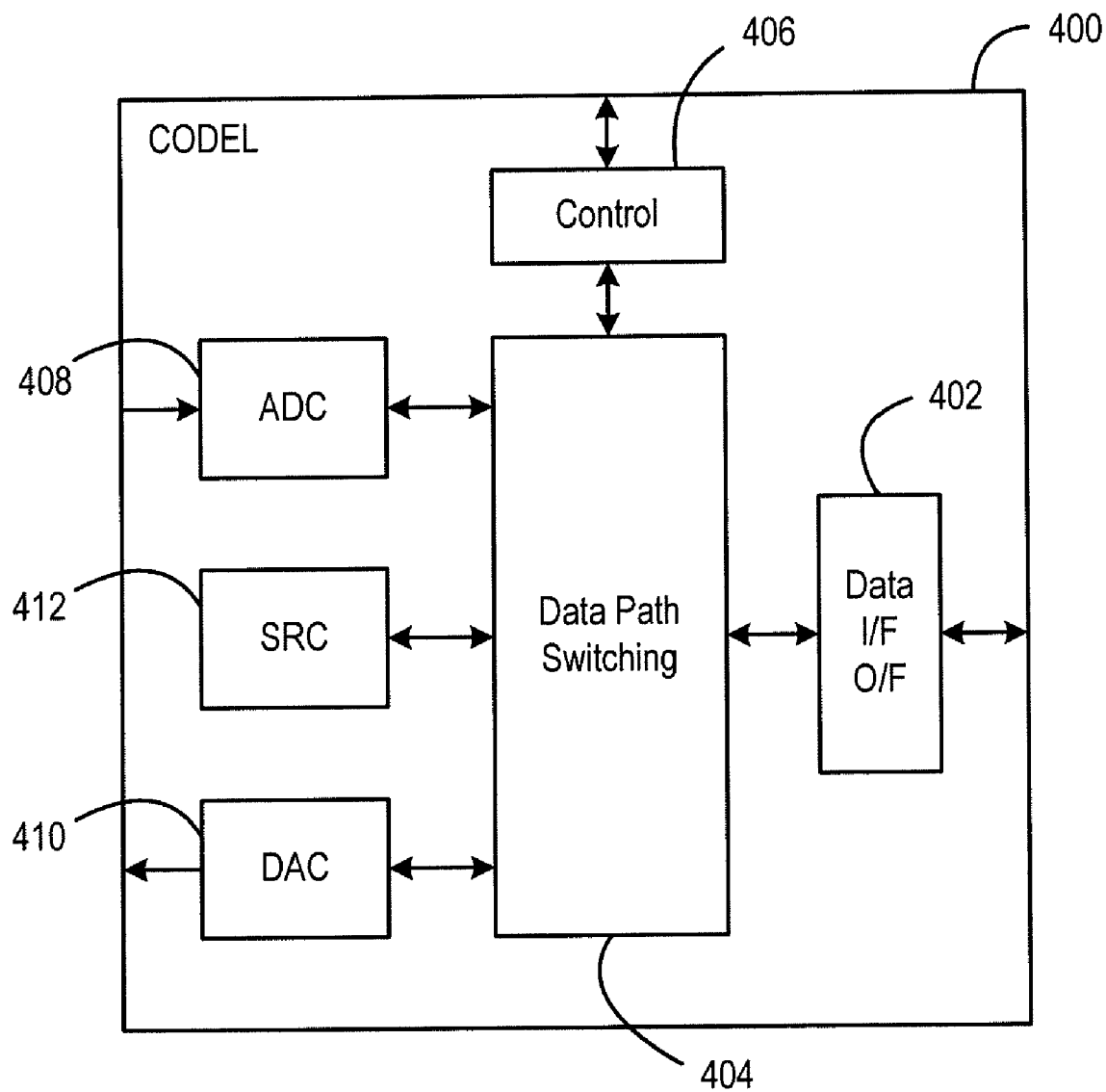
FIG. 7 shows a signal processing device in accordance with a further aspect of the invention.

As one example of such a circuit, FIG. 7 shows a signal processing device in the form of an audio codec 400. The audio codec 400 has input/output circuitry 402 for digital data, connected to data path switching circuitry 404, operating under the control of control circuitry 406. The audio codec 400 also has an input for analogue data connected through an analogue-digital converter (ADC) 408 to the data path switching circuitry 404, and an output for analogue data connected through a digital-analogue converter (DAC) 410 to the data path switching circuitry 404. A sample rate converter 412 is connected to the data path switching circuitry 404, to allow digital data at one sample rate to be converted to digital data at a second sample rate. The sample rate converter is of the general form shown in FIG. 1, incorporating a rate estimator which may be as shown in FIG. 4

The skilled person will recognise that the above-described apparatus and methods may be embodied as processor control code, for example on a carrier medium such as a disk, CD- or DVD-ROM, programmed memory such as read only memory (firmware), or on a data carrier such as an optical or electrical signal carrier. For many applications, embodiments of the invention will be implemented on a DSP (digital signal processor), ASIC (application specific integrated circuit) or FPGA (field programmable gate array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (very high speed integrated circuit hardware description language). As the skilled person will appreciate, the code may be distributed between a plurality of coupled components in communication with one another. Where appropriate, the embodiments may also be implemented using code running on a field-(re-)programmable analogue array or similar device in order to configure analogue/digital hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may

What is claimed is:

1. A sample rate converter circuit, for receiving a first signal at a first sampling frequency and for outputting a second signal, representative of said first signal, having a second sampling frequency, said sample rate converter comprising:
   a buffer, for storing data samples received from said first signal;
   a first loop circuit, for receiving a first clock signal corresponding to said first sampling frequency and a second clock signal corresponding to said second sampling frequency, and for generating an estimate of a ratio of the first sampling frequency to the second sampling frequency; and
   a second loop circuit, for receiving said first clock signal, said second clock signal and said estimate of the ratio of the first sampling frequency to the second sampling frequency, and for outputting a write pointer so that said data samples can be stored in the buffer, and for outputting a read pointer so that said data samples can be read from the buffer,
   with a first offset between said read pointer and said write pointer, such that said first offset is substantially independent of said ratio of the first sampling frequency to the second sampling frequency.

2. A sample rate converter as claimed in claim 1, wherein said first loop circuit comprises a first input integrator clocked by the first clock signal and a first output integrator clocked by the second clock signal, and a subtractor for forming a first error signal based on outputs of the first input integrator and the first output integrator, and wherein the estimate of the ratio of the first sampling frequency to the second sampling frequency is based on said first error signal, and is applied as an input to the first output integrator, and
   wherein said second loop circuit comprises a second input integrator clocked by the first clock signal and a second output integrator clocked by the second clock signal, and a subtractor for forming a second error signal based on outputs of the second input integrator and the second output integrator, and wherein the estimate of the ratio of the first sampling frequency to the second sampling frequency is added to said second error signal, and is applied as an input to the second output integrator.

3. A sample rate converter as claimed in claim 1, wherein said read pointer is formed by adding an additional offset to an output of the second output integrator.

4. A sample rate converter as claimed in claim 3, wherein said additional offset is equal to half a number of slots in the buffer.

5. A sample rate converter as claimed in claim 2, wherein said first loop circuit further comprises:
   a first multiplier, for multiplying the first error signal by a first gain coefficient, wherein said gain coefficient is dynamically adjusted to change the rate of convergence of the first loop circuit to said estimate of the ratio of the first sampling frequency to the second sampling frequency ratio, output by said first loop circuit.

6. A sample rate converter as claimed in claim 5, wherein said first loop circuit is adapted to compensate for the adjustment of the gain coefficient by correspondingly adjusting said error signal.

7. A sample rate converter circuit as claimed in claim 6, wherein said gain coefficient is periodically halved, and wherein said second loop circuit is adapted to double the error signal upon said gain coefficient being halved.

8. A sample rate converter as claimed in claim 5, wherein said second loop circuit comprises:
   a second multiplier, for multiplying the second error signal by a second gain coefficient.

9. A sample rate converter as claimed in claim 8, wherein said first gain coefficient is different from said second gain coefficient, to prevent the first loop circuit and the second loop circuit from interacting with one another.

10. A sample rate converter as claimed in claim 1, wherein said first loop circuit and said second loop circuit are operated at different frequencies, to prevent the first loop circuit and the second loop circuit from interacting with one another.

11. A sample rate converter as claimed in claim 1, wherein said buffer is a circular buffer.

12. A method of converting a signal sample rate from a first sampling frequency to a second sampling frequency, comprising:
    receiving a first signal at the first sampling frequency;
    storing in a buffer data samples received from said first signal;
    receiving a first clock signal corresponding to said first sampling frequency and a second clock signal corresponding to said second sampling frequency in a first loop circuit, and generating an estimate of a ratio of the first sampling frequency to the second sampling frequency; and
    receiving said first clock signal, said second clock signal and said estimate of the ratio of the first sampling frequency to the second sampling frequency in a second loop circuit; and
    outputting a write pointer so that said data samples can be stored in the buffer, and outputting a read pointer so that said data samples can be read from the buffer, with a first offset between said read pointer and said write pointer, such that said first offset is substantially independent of said ratio of the first sampling frequency to the second sampling frequency.

13. A method as claimed in claim 12, comprising:
    in said first loop circuit, clocking a first input integrator by the first clock signal and clocking a first output integrator by the second clock signal, and forming a first error signal based on outputs of the first input integrator and the first output integrator, forming the estimate of the ratio of the first sampling frequency to the second sampling frequency based on said first error signal, and applying said estimate of the ratio of the first sampling frequency to the second sampling frequency as an input to the first output integrator, and
    in said second loop circuit, clocking a second input integrator by the first clock signal and clocking a second output integrator by the second clock signal, and forming a second error signal based on outputs of the second input integrator and the second output integrator, adding to said second error signal the estimate of the ratio of the first sampling frequency to the second sampling frequency, and applying the sum as an input to the second output integrator.

14. A sample rate converter circuit, for receiving a first signal having a first sampling frequency and for outputting a second signal, representative of said first signal, having a second sampling frequency, said sample rate converter comprising:
    a loop circuit, for receiving a first clock signal corresponding to said first sampling frequency and a second clock signal corresponding to said second sampling frequency, and for generating an estimate of a frequency ratio of the first sampling frequency to the second sampling frequency, wherein the loop circuit comprises:
- a multiplier, for multiplying an error signal of the loop circuit by a gain coefficient, wherein said gain coefficient is dynamically adjusted to change the rate of convergence of the loop circuit to the estimate of the frequency ratio,
- wherein the sample rate converter circuit is adapted to compensate for the adjustment of the gain coefficient by correspondingly adjusting said error signal.

15. A sample rate converter circuit as claimed in claim 14, comprising an input integrator clocked by the first clock signal and an output integrator clocked by the second clock signal and a subtractor for forming the error signal of the loop circuit based on outputs of the input integrator and the output integrator.

16. A sample rate converter circuit as claimed in claim 14, wherein said gain coefficient is periodically halved, and wherein the circuit is adapted to double the error signal upon said gain coefficient being halved.

17. A sample rate converter as claimed in claim 15, further comprising a control circuit adapted periodically to halve said gain coefficient,
- further comprising an adder, for forming a difference of the outputs of the input integrator and the output integrator, wherein said control circuit is further adapted to cause said difference of the outputs of the input integrator and the output integrator to be added to the output of the output integrator to form a sum,
- wherein the subtractor is connected to form the error signal by subtracting said sum from the output of the input integrator.

18. A method of controlling a sample rate converter circuit, the sample rate converter circuit being adapted to receive a first signal having a first sampling frequency and to output a second signal, representative of said first signal, having a second sampling frequency, said sample rate converter comprising:
- a loop circuit, for receiving a first clock signal corresponding to said first sampling frequency and a second clock signal corresponding to said second sampling frequency, and for generating an estimate of a frequency ratio of the first sampling frequency to the second sampling frequency, wherein the loop circuit comprises:
- a multiplier, for multiplying an error signal of the loop circuit by a gain coefficient,
- wherein the method comprises dynamically adjusting said gain coefficient to change the rate of convergence of the loop circuit to the estimate of the frequency ratio,
- and further comprises compensating for the adjustment of the gain coefficient by correspondingly adjusting said error signal.

19. A signal processing circuit, comprising an input for receiving a first signal at a first sampling frequency and an output for outputting a second signal, representative of said first signal, at a second sampling frequency, said signal processing circuit comprising a sample rate converter circuit as claimed in claim 1.

20. A signal processing circuit as claimed in claim 19, wherein said signal processing circuit comprises an audio codec.

* * * * *